United States Patent
Daum

[19]

[11] Patent Number: 5,821,582
[45] Date of Patent: *Oct. 13, 1998

[54] STRUCTURES FOR PREVENTING REVERSE ENGINEERING OF INTEGRATED CIRCUITS

[75] Inventor: Keith E. Daum, Redwood City, Calif.

[73] Assignee: National Semiconductor Corp., Santa Clara, Calif.

[ * ] Notice: The term of this patent shall not extend beyond the expiration date of Pat. No. 5,369,299.

[21] Appl. No.: 480,003

[22] Filed: Jun. 7, 1995

Related U.S. Application Data

[63] Continuation of Ser. No. 96,153, Jul. 22, 1993, Pat. No. 5,468,990.

[51] Int. Cl.⁶ .......................... H01L 29/76; H01L 29/94; H01L 31/062; H01L 31/113

[52] U.S. Cl. .......................... 257/327; 257/635; 257/637; 257/59

[58] Field of Search .............................. 257/59, 327, 632, 257/635, 637, 638, 639, 640, 641, 642, 643, 644, 645, 649, 650, 660, 687, 797, 907, 922

[56] References Cited

U.S. PATENT DOCUMENTS

| | | | |
|---|---|---|---|
| 4,030,952 | 6/1977 | Luce et al. .................................. | 257/635 |
| 5,030,796 | 7/1991 | Swanson et al. ......................... | 257/687 |
| 5,070,386 | 12/1991 | Imura ........................................ | 257/641 |
| 5,109,267 | 4/1992 | Koblinger et al. ....................... | 257/760 |
| 5,231,299 | 7/1993 | Ning et al. ................................ | 257/316 |
| 5,308,682 | 5/1994 | Morikawa ................................ | 257/797 |
| 5,337,274 | 8/1994 | Ohji .......................................... | 365/185 |
| 5,369,299 | 11/1994 | Byrne ....................................... | 257/638 |
| 5,468,990 | 11/1995 | Daum ....................................... | 257/632 |

FOREIGN PATENT DOCUMENTS

| | | | |
|---|---|---|---|
| 221 351 | 10/1985 | European Pat. Off. . | |
| 0 169 941 | 2/1986 | European Pat. Off. ............... | 257/922 |
| 61-51950 | 3/1986 | Japan . | |
| 61-147551 | 7/1986 | Japan ..................................... | 257/922 |
| 63-170944 | 7/1988 | Japan . | |
| 1165129 | 6/1989 | Japan . | |
| 2 223 355 | 4/1990 | United Kingdom ................... | 257/922 |

OTHER PUBLICATIONS

Ghandhi, *VLSI Fabrication Principles,* John Wiley, 1983, pp. 494–495.

Research Disclosure (author unknown), "New Encapsulants for Computer Chip and Circuit Protection," No. XP 000134193, Kenneth Mason Publications, Jul., 1990, p. 588.

*Primary Examiner*—Stephen Meier
*Attorney, Agent, or Firm*—Skjerven, Morrill, MacPherson, Franklin & Friel; David T. Millers

[57] ABSTRACT

Embodiments according to the present invention provide tamper resistant structures which make it more difficult to reverse engineer integrated circuits. In one embodiment, a tamper resistant structure on a passivation layer leaves portions of the passivation layer exposed. Mechanical or chemical removal of the tamper resistant structure damages exposed portions of the passivation layer and makes reverse engineering difficult. Other embodiments of the tamper resistant structure include patterned and unpatterned structures containing hard materials, chemically resistant materials, amalgams, fibrous materials, and/or meshes attached to a passivation layer. Tamper resistant structures can also be provided between layers of the active circuitry.

2 Claims, 2 Drawing Sheets

STRUCTURES FOR PREVENTING REVERSE ENGINEERING OF INTEGRATED CIRCUITS

This application is a continuation of application Ser. No. 08/096,153, filed Jul. 22, 1993 now U.S. Pat. No. 5,468,990.

CROSS-REFERENCES TO RELATED APPLICATIONS

This application is related to, and incorporates by reference, the U.S. Pat. No. 5,369,299 entitled "TAMPER RESISTANT INTEGRATED CIRCUIT STRUCTURE".

BACKGROUND OF THE INVENTION

1. Field of the Invention

This invention relates to structures which prevent tampering with or reverse engineering of integrated circuits.

2. Description of Related Art

Integrated circuit (IC) manufacturers and users have several reasons for wanting to protect the contents of ICs. Some manufacturers would like to stop reverse engineering and copying of circuit designs. Some users would like to prevent copying or changing of software and information stored in ICs. In either case, there is a need to provide structures on ICs that make disassembly and reverse engineering more difficult.

One method of reverse engineering is to successively remove layers from an IC and examine the structure of each layer as it is exposed. Since adjacent layers in a IC often have different chemical properties, chemical processes can be chosen that remove the top layer but leave underlying layers intact. In this way, the layers of an IC can in effect be peeled off and the IC's structure determined.

Stored information can also be determined by disassembling an IC either by determining structure or measuring stored charge. In EPROMs, E$^2$PROMS, and similar ICs, information and software is stored as trapped electrical charge. If layers of an IC can be removed without significantly changing trapped charges, the information or software contained in the IC can be copied or changed.

The prior art has not provided a tamperproof IC which prevents reverse engineering or tampering with stored information. Structures are needed which make reverse engineering of ICs and tampering with ICs more difficult.

SUMMARY OF THE INVENTION

Embodiments according to the present invention provide tamper resistant structures which make reverse engineering of integrated circuits more difficult.

In one embodiment of the present invention, an integrated circuit includes a tamper resistant structure overlying active circuitry, typically on a passivation layer overlying active circuitry. The tamper resistant structure has a pattern that covers portions of the passivation layer but leaves other portions of the passivation layer exposed. The composition of the tamper resistant structure is such that removal of the tamper resistant structure damages portions of the passivation layer and makes reverse engineering of the active circuitry more difficult.

The compositions of the tamper resistant structure and the passivation layer may be chosen such that for most etchants, the tamper resistant structure has a slower etch rate than does the passivation layer. The tamper resistant structure may also be thicker than the passivation layer. Etchants remove exposed portions of the passivation layer and damage underlying active circuitry before the tamper resistant structure is removed.

The tamper resistant structure can be formed by chemical deposition of a layer which is etched to provide openings or by attaching a fibrous material, amalgam, or mesh to the passivation layer.

When the tamper resistant structure is harder than the passivation layer, mechanical removal of the tamper resistant structure damages the underlying passivation layer. For example, during any mechanical removal, pieces of the tamper resistant structure break loose and act as an abrasive which damages the underlying passivation layer. Forces applied to the tamper resistant structure during mechanical removal are transferred to the underlying passivation layer and cause cracks and breaks in the passivation layer.

According to another embodiment of the invention, a tamper resistant structure contains an amalgam of abrasive particles suspended in a ductile suspension material. The amalgam can be patterned (with openings that expose portions of passivation) or unpatterned (without openings). During removal by grinding, the abrasive particles scratch the passivation layer and underlying active circuitry.

In other embodiments, a tamper resistant structure contains the structure of any one of the above-described embodiments but is provided between two layers which form the active circuitry of an IC instead of being on a passivation layer.

This invention will be more fully understood in view of the following detailed description taken together with the drawings.

DETAILED DESCRIPTION OF THE PREFERRED EMBODIMENTS

Embodiments of the present invention prevent tampering with or reverse engineering of ICs by providing tamper resistant structures which are difficult to remove without also damaging portions of a passivation layer or underlying circuitry. Reverse engineering is more difficult because when in place, the tamper resistant structure blocks or obscures views of the underlying structure, and when the tamper resistant structure is removed, portions of the IC are destroyed. Destroyed portions of active circuitry are difficult or impossible to reverse engineer. Even where active circuitry is not destroyed, reverse engineering is more difficult because damage in the passivation layer scatters light in an irregular pattern and makes viewing of underlying circuitry difficult.

Figure 1:
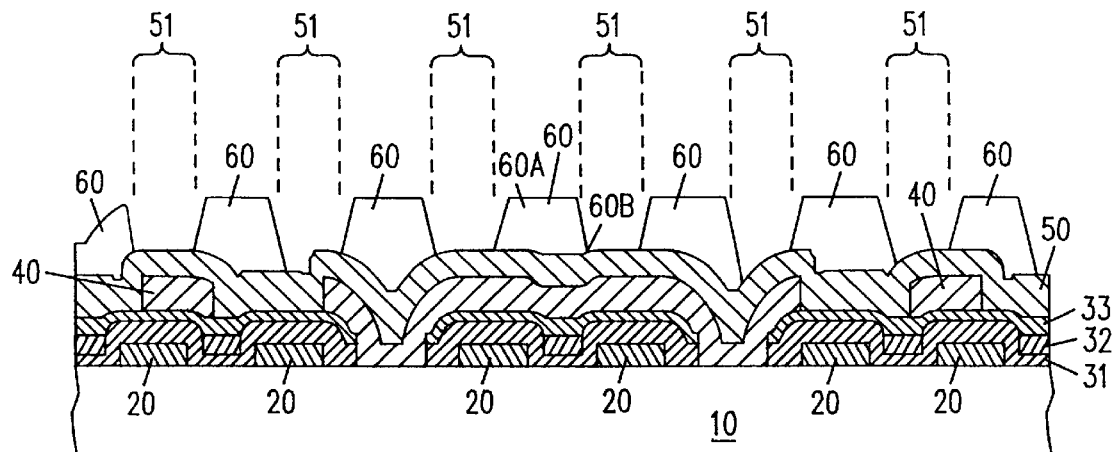
FIG. 1 shows a cross-sectional view of an integrated circuit with a tamper resistant structure according to a first embodiment of the present invention.

FIG. 1 shows a cross-sectional view of an integrated circuit (IC) having a tamper resistant structure 60 in accordance with an embodiment of the present invention. Active circuitry in the IC is formed in substrate 10 and in layers overlying substrate 10. The active circuitry may be formed using MOS, CMOS, bipolar, or other appropriate technologies.

The remainder of this disclosure is restricted to the case where the IC is manufactured using silicon technology and semiconductor substrate 10 is silicon. As will be appreciated by those skilled in the art, other materials such as germanium or gallium-arsenide and other related IC fabrication technologies can be used in other embodiments of the present invention.

In FIG. 1, the active circuitry includes doped regions (not shown) formed in substrate 10, polycrystalline silicon traces 20, insulating regions 31, 32, and 33, and metal traces 40. Insulating regions 31 isolate elements in the active circuitry and are typically formed of silicon dioxide. Insulating regions 32 are typically of spin-on glass or polyimide and used to provide planarization, while regions 33 are formed from a sealing layer of silicon dioxide. Metal traces 40 provide electrical connections and are typically made of aluminum.

The active circuitry formed from the layers shown in FIG. 1 is illustrative only. The precise form of active circuitry is not crucial to this invention, because disclosed tamper resistant structures do not significantly react with or change the electrical performance of the active circuitry. Disclosed tamper resistant structures are therefore generally applicable to known or yet to be developed IC technology.

Overlying the active circuitry is a passivation layer 50 which protects active circuitry from scratches and contamination. Passivation layers are typically made of materials, such as silicon dioxide, silicon nitride, oxynitride mixtures, or other materials which are scratch resistant electrical insulators that provide a moisture and contaminant barrier. Overlying passivation layer 50 is a tamper resistant structure 60. Tamper resistant structure 60 has a pattern with openings which expose portions 51 of passivation layer 50.

According to one embodiment of the invention, tamper resistant structure 60 is formed from a chemically resistant material that is difficult to etch. Examples of good chemically resistant materials are silicon nitride, silicon carbide, aluminum oxide, and aluminum nitride. The ideal material for this embodiment of the invention would have a chemical composition such that any etch that attacks tamper resistant structure 60, also attacks exposed portions 51 of passivation layer 50 and etches passivation layer 50 at a faster rate.

Both the composition of passivation layer 50 and the composition of tamper resistant structure 60 may be chosen so that passivation layer 50 etches faster for most or all common etchants. For example, a glass or silicon dioxide passivation layer with an overlying tamper resistant structure containing silicon nitride provides the desired etch rate differential for most common etchants. Another example of compositions which provide a large etch rate differential for most etchants is a silicon dioxide passivation layer and a tamper resistant structure containing aluminum oxide. As will be apparent to those skilled in the art, other combinations of passivation layer and tamper resistant structure provide similar performance.

In another embodiment, tamper resistant structure 60 includes a number of layers each having different chemical properties, wherein the different layers are chemically resistant to different chemical etchants.

In still another embodiment of the invention, tamper resistant structure 60 is made from the same material as passivation layer 50 and is thicker than passivation layer 50. Tamper resistant structure 60, being thicker, takes longer to remove than does passivation layer 50. Etchants which remove tamper resistant structure 60 also remove exposed portions of passivation layer 50 and destroy portions of the underlying circuitry.

The tamper resistant structure 60 can be formed using conventional IC fabrication techniques, such as chemical vapor deposition followed by masking and etching to create a pattern which exposes portions 51 of passivation layer 50.

Figure 2:
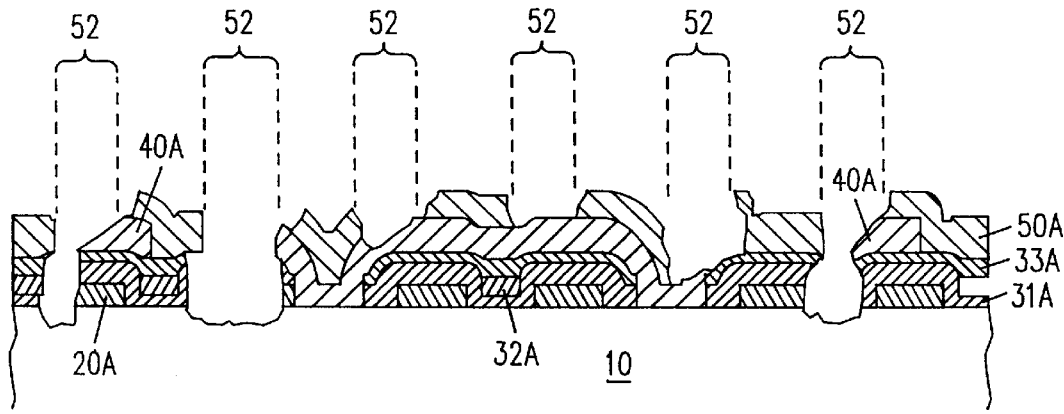
FIG. 2 shows a cross-sectional view of the integrated circuit of FIG. 1 after a wet etch or plasma etch removed the tamper resistant structure.

FIG. 2 shows the IC of FIG. 1 after etching to remove tamper resistant structure 60. During etching, exposed portions 51 of passivation layer 50 are removed, and because tamper resistant structure 60 takes longer to remove than does passivation layer 50, the etching acts on portions 52 of active circuitry beneath exposed portion 51 of passivation layer 50. Portions 52 of active circuitry are damaged. The amount of damage depends on the type of etch used and the time the etch is applied to the active circuitry.

Polysilicon traces 20A, insulating regions 31A, 32A, and 33A, metal traces 40A, and passivation layer 50A in FIG. 2 are the remainders after chemical removal of tamper resistant structure 60, of the polysilicon traces 20, insulating regions 31, 32, and 33, metal traces 40, and passivation layer 50 in FIG. 1.

Wet etches and plasma etches used to remove layers of an IC remove different layers at different etch rates. The etch rates depend on the chemical properties of the layer removed and etch used. For example, a thirteen-to-two buffered oxide etch (a thirteen parts ammonium fluoride and two parts hydrofluoric acid mixture) etches silicon dioxide quickly, etches silicon nitride slowly, and etches aluminum and polysilicon at an intermediate rate. (The exact etch rates depends on how the etchant is applied.) If tamper resistant structure 60 contains silicon nitride and passivation layer 50 is formed from silicon dioxide, a wet etch using thirteen-to-two oxide etch destroys large portions of passivation layer 50 and the underlying active circuitry including portion of insulating regions 31, 32, and 33, polycrystalline silicon traces 20, and metal traces 40.

When the chemical composition of tamper resistant structure 60 and passivation layer 50 differ, etches, particularly plasma etches, may be available which etch tamper resistant structure 60 at the same rate as or faster than passivation layer 50. However, in the embodiment where tamper resistant structure 60 and passivation layer 50 have the same composition etch rates must be the same.

FIG. 1 shows tamper resistant structure 60 having openings which are regularly space and have a size on the order of the feature size of the IC. The actual pattern used can vary. For example, random patterns of squares, rectangles, triangles, or other regions may be regularly or irregularly spaced on the IC with openings between the regions. The tamper resistant structure can be tailored to cover specific active circuitry, instead of being random. The tamper resistant structure can cover an entire chip or be limited to a particular area of the chip to be protected. The size of the portions exposed or covered can range from the feature size of the circuit to many times the feature size, but should not be made so large that individual regions in the pattern of the tamper resistant structure can be mechanically removed.

Referring again to FIG. 1, tamper resistant structure 60 protects against mechanical removal of layers of an IC. Parallel grinding is a precision technique that grinds away the surface of an IC parallel to the substrate. If tamper resistant structure 60 is harder than passivation layer 50, forces applied to tamper resistant structure 60, during parallel grinding or other mechanical removal, are transferred to passivation layer 50. Passivation layer 50, being softer, tends to be damaged before tamper resistant structure 60. For example, a force applied to a region 60A of tamper resistant structure 60 may cause region 60A to push down at corner 60B. Passivation layer 50 breaks first.

Also, pieces of tamper resistant structure 60 can break off during grinding. When pieces of tamper resistant structure 60 break off, the pieces may pull off pieces of passivation layer 50. Further, the broken pieces act as an abrasive which further damages the underlying IC. Grinding becomes difficult to control because the size of broken pieces is unpredictable. The damage caused to underlying layers makes reverse engineering difficult because active circuitry is destroyed and because an irregular surface is created. The irregular surface obscures underlying structure and makes focusing of optical measuring instruments difficult.

Figure 3:
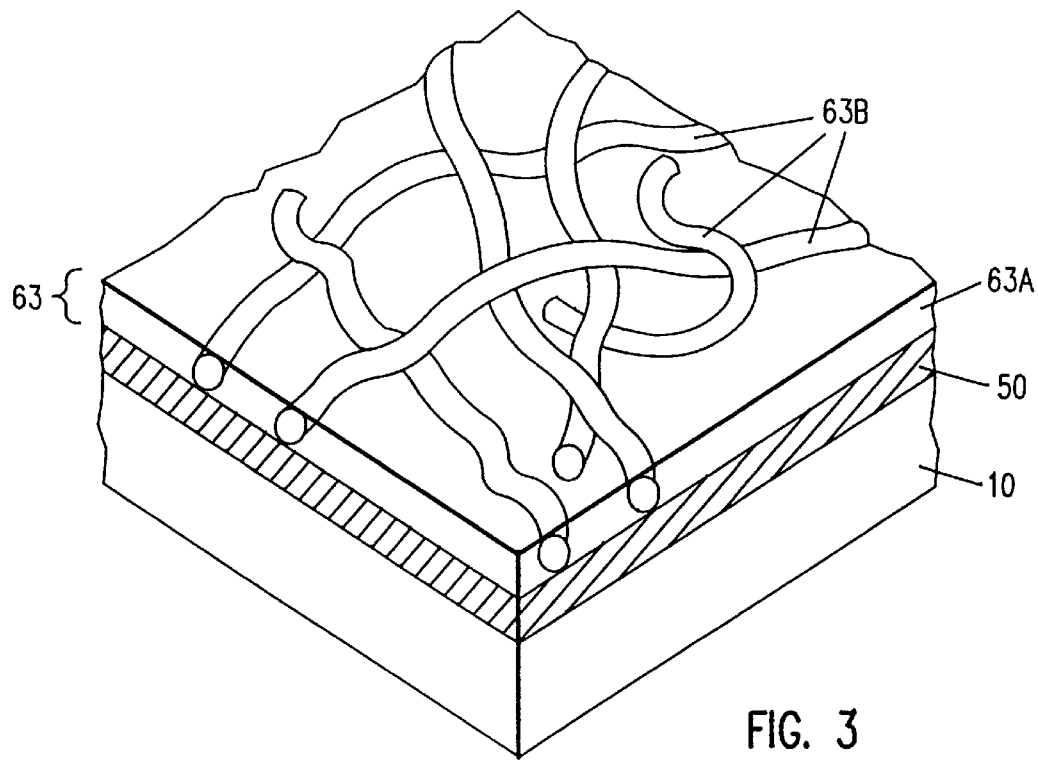
FIG. 3 shows a perspective drawing of fibrous material used as a tamper resistant structure according to a second embodiment of the present invention.

FIG. 3 shows a perspective view of an embodiment of the invention that employs a tamper resistant structure 63 which contains a fibrous material 63B attached to passivation layer 50 above active circuitry in and on substrate 10. Fibrous material 63B can be made from for example from boron nitride or another relatively hard material, and may consist of strands from about 5 μm to 20 μm in length and from about 1 μm to 10 μm wide.

Fibrous material 63B can be made in a number of ways. For example, a layer of boron nitride or other suitable hard material can be deposited on a layer of silicon dioxide using conventional techniques. The boron nitride layer can then be masked and etched to provide strands of approximately the desired size. A hydrofluoric acid etch then dissolves the underlying silicon dioxide layer, and lifts off the strands of boron nitride.

Fibrous material 63B is attached to passivation layer 50 by a binder material such as a resin. Typically, fibrous material 63B is enclosed in a layer 63A of resin or other binder to make fibrous material 63B more difficult to remove. During mechanical removal of tamper resistant structure 63, pieces of fibrous material 63B break lose and act as an abrasive which damages passivation layer 50 and the underlying circuitry.

Figure 4:
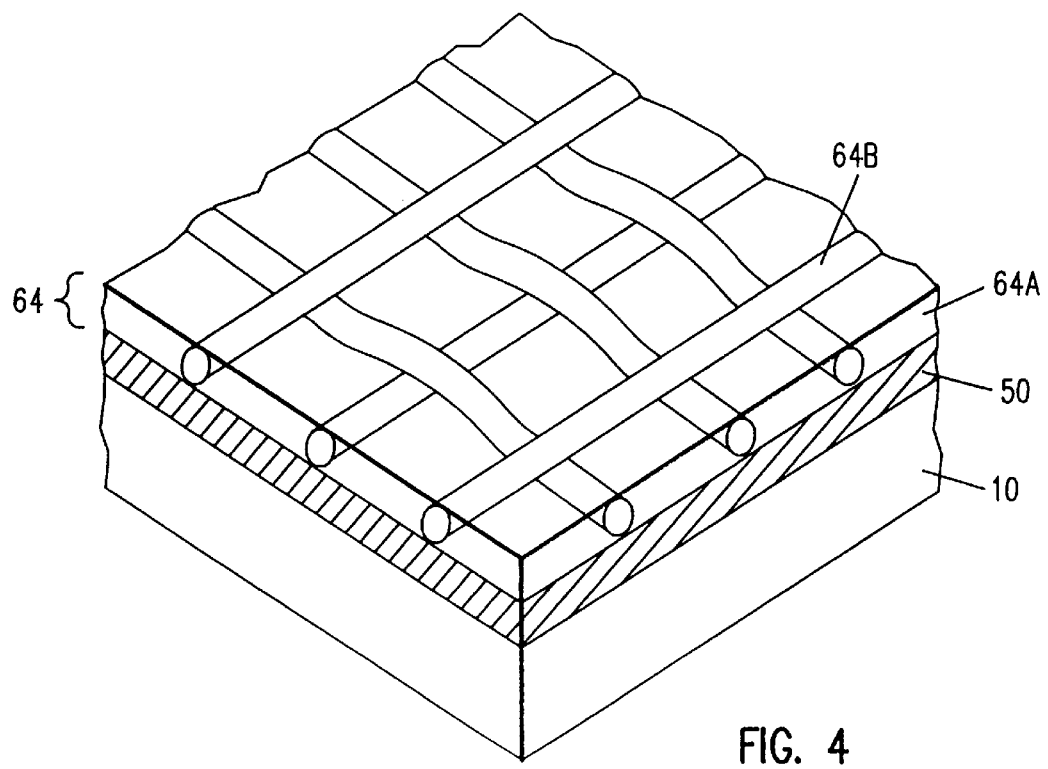
FIG. 4 shows a perspective drawing of a mesh used as a tamper resistant structure according to a third embodiment of the present invention.

FIG. 4 shows an embodiment of the invention where a mesh 64B of fibrous material is applied to passivation layer 50. Mesh 64B is made from material similar to that described in regard to FIG. 3, and can be attached in the same manner. Mesh 64B is enclosed in a resin layer 64A. Resin layer 64A need not be provided in some embodiments. As described in regard to FIG. 3, pieces of fibrous material break loose from mesh 64B during grinding and act as an abrasive which damages underlying structures.

Figure 5:
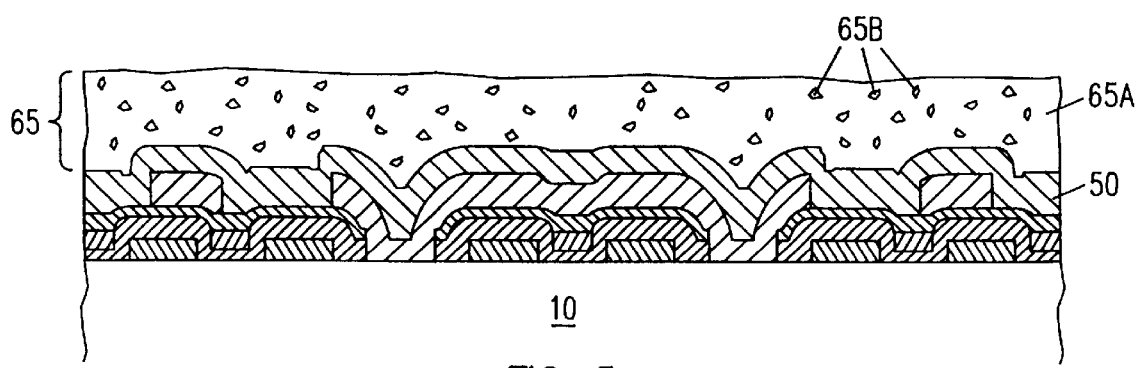
FIG. 5 shows a cross-sectional drawing of an integrated circuit having an amalgam layer according to a fourth embodiment of the present invention.

FIG. 5 shows a cross-sectional view of still another tamper resistant structure according to the present invention. Tamper resistant structure 65 overlies passivation layer 50 and active circuitry formed in and on substrate 10. Tamper resistant structure 65 can be patterned with openings that expose portions of passivation layer 50 or can be unpatterned and without openings.

Tamper resistant structure 65 is an amalgam or composite that includes a suspension material 65A and abrasive particles 65B. Any desired thickness can be provided, but most typically, tamper resistant structure 65 would between about 1 μm and 10 μm thick. Suspension material 65A is typically a ductile material such as a resin. Abrasive particles 65B are made of a hard material such as boron nitride, silicon nitride, silicon carbide, or aluminum oxide, and vary in size from 1 μm to 10 μm. An alternative to providing particles in the amalgam is to provide strands of abrasive fibers in suspension material 65A. Removal of tamper resistant structure 65 by grinding causes damage because abrasive particles 65B scratch underlying layers during grinding.

The above-described embodiments refer to forming tamper resistant structures on a passivation layer. Alternatively, tamper resistant structures may be provided beneath the passivation layer or between layers that form the active circuitry. One disadvantage of placing a tamper resistant structure between layers which form the active circuitry is that the tamper resistant structure only protects underlying layers. Another disadvantage is that forming a tamper resistant structure which does not interfere with the electrical properties of the circuit can be more difficult when the structure is in contact with or between layers that form active circuitry.

Although the present invention has been described with reference to particular embodiments, the description is only an example of the invention's application and should not be taken as a limitation. Many combinations and variations of the structures disclosed will be obvious to those skilled in light of this disclosure and are within the scope of the invention. For example, the fibrous, mesh, or amalgam tamper resistant structures disclosed in regard to FIGS. 3, 4, and 5 can be formed in a pattern as disclosed in regard to FIG. 1. Structures disclosed as layers may instead have multiple layers formed using well known techniques. Further, the disclosed embodiments of tamper resistant structures can be stacked or layered one on top of another rather than being applied directly to a passivation layer.

We claim:

1. An integrated circuit comprising:

active circuitry;

a passivation layer overlying the active circuitry; and a tamper resistant structure formed overlying the active circuitry, the tamper resistant structure having a pattern with openings overlying portions of the active circuitry, wherein:

the tamper resistant structure and the openings do not implement, change, or perform an electrical function for the active circuitry;

the composition of tamper resistant structure differs from the composition of the passivation layer, and for at least one type of etchant, the tamper resistant structure has a slower etch rate than the passivation layer;

the tamper resistant structure is formed on the passivation layer so that the openings in the tamper resistant structure expose portions of the passivation layer and removal of the tamper resistant structure damages portions of the passivation layer; and the tamper resistant structure has a composition such that chemical removal of the tamper resistant structure damages portions of the integrated circuit underlying the openings and makes analysis of the active circuitry more difficult.

2. An integrated circuit comprising:

active circuitry;

a passivation layer overlying the active circuitry; and a tamper resistant structure formed overlying the active circuitry, the tamper resistant structure having a pattern with openings overlying portions of the active circuitry, wherein:

the tamper resistant structure and the openings do not implement, change, or perform an electrical function for the active circuitry;

the tamper resistant structure and the passivation layer have the same composition;

the tamper resistant structure is thicker than the passivation layer;

the tamper resistant structure is formed on the passivation layer so that the openings in the tamper resistant structure expose portions of the passivation layer and removal of the tamper resistant structure damages portions of the passivation layer; and the tamper resistant structure has a composition such that chemical removal of the tamper resistant structure damages portions of the integrated circuit underlying the openings and makes analysis of the active circuitry more difficult.

* * * * *